United States Patent [19]

Meissner et al.

[11] Patent Number: 4,714,887
[45] Date of Patent: Dec. 22, 1987

[54] NUCLEAR MAGNETIC RESONANCE TOMOGRAPHY APPARATUS

[75] Inventors: Ralph Meissner, Erlangen; Walter Popp, Emskirchen, both of Fed. Rep. of Germany

[73] Assignee: Siemens Aktiengesellschaft, Berlin and Munich, Fed. Rep. of Germany

[21] Appl. No.: 849,404

[22] Filed: Apr. 8, 1986

[30] Foreign Application Priority Data

Apr. 26, 1985 [DE] Fed. Rep. of Germany ....... 3515190

[51] Int. Cl.⁴ .............................................. G01R 33/20
[52] U.S. Cl. ...................................... 324/322; 324/318
[58] Field of Search ............... 324/300, 322, 318, 309; 128/653, 1.5

[56] References Cited

U.S. PATENT DOCUMENTS

| 4,411,270 | 10/1983 | Damadian | 128/653 |
| 4,520,315 | 5/1985 | Loeffler et al. | 324/309 |
| 4,594,566 | 6/1986 | Maudsley | 324/318 |
| 4,607,226 | 8/1986 | Zeiger | 324/300 |
| 4,636,730 | 1/1987 | Bottomley | 324/322 |
| 4,641,097 | 2/1987 | Bottomley et al. | 324/322 |

FOREIGN PATENT DOCUMENTS

| 0047065 | 3/1982 | European Pat. Off. . |
| 0105550 | 4/1984 | European Pat. Off. . |
| 2137757 | 10/1984 | United Kingdom . |
| WO00214 | 1/1984 | PCT Int'l Appl. . |

Primary Examiner—Michael J. Tokar
Assistant Examiner—Louis M. Arana
Attorney, Agent, or Firm—Hill, Van Santen, Steadman & Simpson

[57] ABSTRACT

A tomography apparatus utilizing nuclear magnetic resonance techniques for representing internal cross-sections of an examination subject has a surface coil for acquiring a signal corresponding to the displacement of the nuclear spins of the examination subject from a equilibrium position. The surface coil is annular and has its ends connected to ground through respective capacitances. A tape-shaped high-frequency shielding at least partially surrounds the surface coil.

10 Claims, 4 Drawing Figures

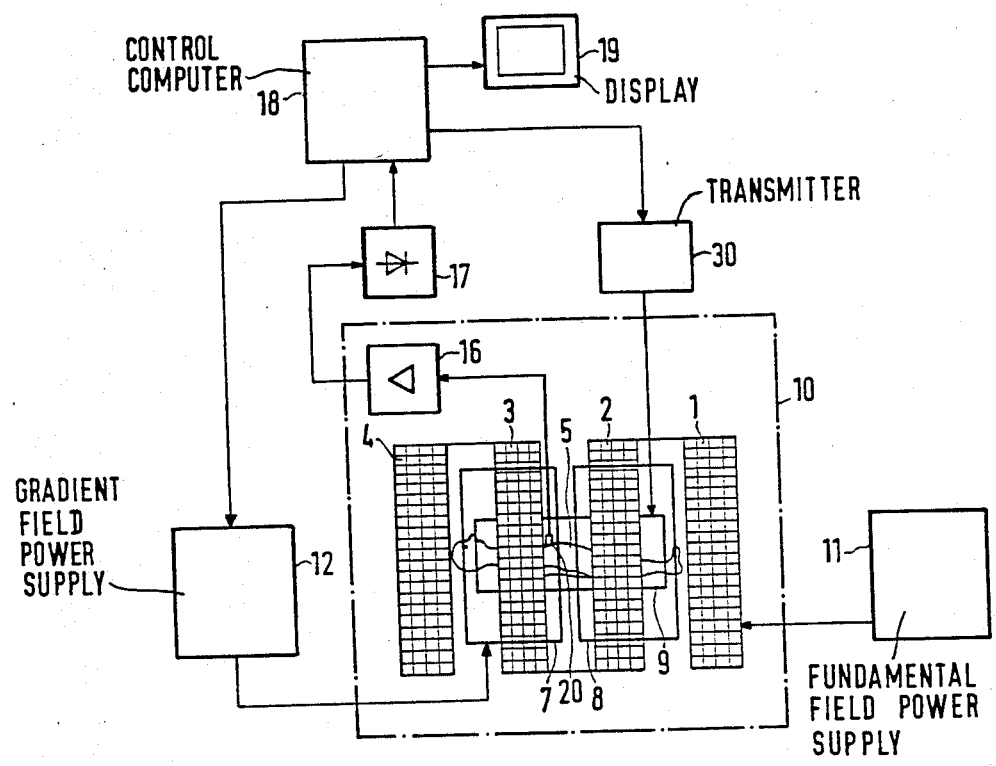
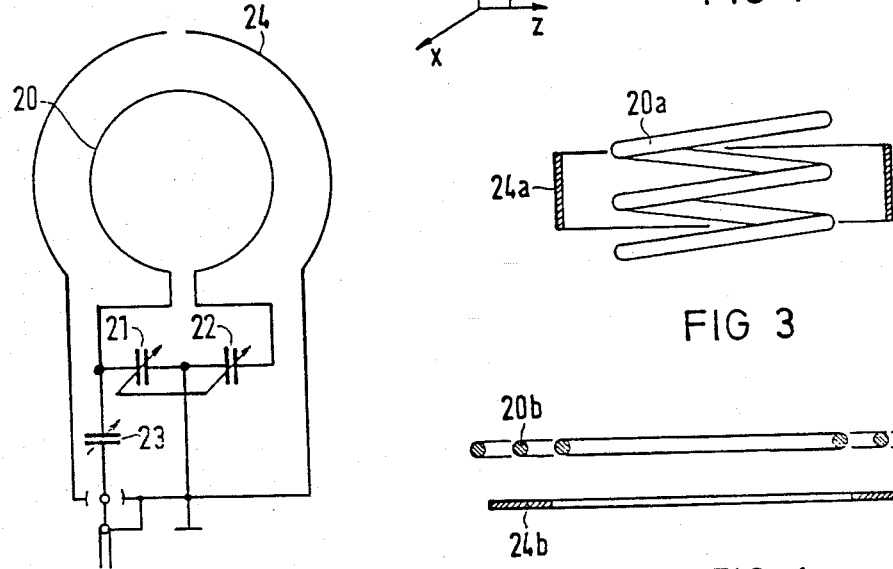

NUCLEAR MAGNETIC RESONANCE TOMOGRAPHY APPARATUS

BACKGROUND OF THE INVENTION

1. Field of the Invention

The present invention relates to nuclear magnetic resonance tomography devices, and in particular to such a device for visual presentation of interior regions of an examination subject having coils for generating fundamental and gradient magnetic field in which the examination subject is disposed, and a surface coil for acquiring a signal corresponding to the displacement of the nuclear spin of the examination subject from an equilibrium position.

2. Description of the Prior Art

A nuclear magnetic resonance tomography apparatus having coils for generating a fundamental magnetic field and coils for generating a gradient magnetic field is described in U.S. Pat. No. 4,520,315. This apparatus does not make use of a surface coil. In this device, it is possible to deflect the nuclear spins of an examination subject from a preferred orientation, which is determined by a fundamental magnetic field. The deflection occurs by means of a high-frequency excitation pulse. A signal is generated when the nuclear spin subsides after the excitation pulse, the frequency of this signal depending upon the strength of the fundamental magnetic field. By superimposing a field gradient on the homogeneous fundamental magnetic field, so that the magnetic field distribution is spatially varied, it is possible to locate areas responding differently to the pulse by measuring the respective frequencies in the region of interest. A cross-section image of the examination subject can be generated in this manner by changing the direction of the field gradient. Excitation in a layer of the examination subject is undertaken by acting on the fundamental magnetic field with a further field gradient so that excitation of the nuclear spin occurs only in the selected layer. This is possible because the excitation occurs only with a frequency which is specifically allocated to the magnetic field in the selected layer.

It is known to improve the chronological resolution in the region of interest in such nuclear magnetic resonance tomography devices by employing a surface coil which has an improved signal-to-noise ratio. Transmission from the surface coil to processing circuitry can then be undertaken with a larger antenna, called a body resonator, for generating a uniform field in the region of the surface coil. The signals generated by the nuclei are received with the surface coil, however, it is also theoretically possible to transmit as well as receive with such a surface coil.

When such a conventional surface coil is placed on the body region to be examined, a frequency detuning caused by electrical losses in the body tissue occurs.

SUMMARY OF THE INVENTION

It is an object of the present invention to provide a nuclear magnetic resonance tomography apparatus which permits fully symmetrical frequency tuning of the surface coil.

The above object is inventively achieved in a nuclear magnetic resonance tomography apparatus having an annular surface coil having its ends connected to ground through respective capacitances and surrounded by a high-frequency shielding having a gap in registry with the center of the surface coil. The surface coil may be in the form of a circular ring, and oval, a rectangle or other shaped rings, depending upon the use. The frequency detuning as a result of electrical losses of the tissue of the examination subject is minimized.

DESCRIPTION OF THE DRAWINGS

FIG. 1 is a block circuit diagram of a nuclear magnetic resonance tomography apparatus of the type in which a surface coil constructed in accordance with the principles of the present invention may be used.

FIG. 2 is a plane view and circuit diagram of a surface coil constructed in accordance with the principles of the present invention.

FIG. 3 is a side view in section of a first embodiment of the surface coil shown in FIG. 2.

FIG. 4 is a side sectional view of another embodiment of a surface coil constructed in accordance with the principles of the present invention.

DESCRIPTION OF THE PREFERRED EMBODIMENTS

A nuclear magnetic resonance tomography apparatus as is shown in FIG. 1 having coils 1, 2, 3 and 4 for generating a fundamental magnetic field $B_o$. An examination subject 5 is disposed in the field for medical diagnosis. The apparatus also has sets of gradient coils for generating independent orthogonal magnetic field gradience in the x, y and z directions as shown in the convention referenced at 6. For clarity, only gradient coils 7 and 8 are shown in FIG. 1. These coils, in combination with a pair of identical gradient coils disposed opposite thereto, generate the x-gradient. The identical sets of y-gradient coils (not shown) are disposed parallel to the subject 5 above and below the subject, and the sets of z-gradient coils (not shown) are disposed at the head and feet of the subject 5 at right angles to the longitudinal axis of the subject 5. The apparatus also has a coil 9 for generating and receiving the nuclear magnetic resonance signals.

The actual examination instrument in which the subject 5 is disposed is indicated by the dot-dash line 10. The apparatus is operated with associated circuitry including a power supply 11 for the fundamental field coils 1, 2, 3 and 4, and a power supply 12 for the gradient coils 7 and 8 and the other gradient coils not shown. A surface coil 20 is provided for acquiring the nuclear magnetic resonance signal and is connected to a process control computer 18 through a signal amplifier 16 and a phase-sensitive rectifier 17. A visually perceivable image is generated on a display unit 19 based on signals received from the control computer 18. The coil 9 is also connected to the control computer 18 through a transmitter 30.

As shown in FIG. 2, the surface coil 20 is a coil having a single winding which is formed of a copper ribbon having a length shorter than λ/4, preferably shorter than λ/8. The shape of the coil 20 is adapted to the particular application, and may also be flexible for individual patient adaptation. The two ends of the copper ribbon are connected to ground through identical variable capacitances 21 and 22. The resonance frequency is set by means of the capacitances 21 and 22. The high-frequency feed is undertaken through a variable capacitance 23, which has one side connected to the surface coil 20. It does not matter to which end of the coil 20 the capacitance 23 is connected. A shielding tape 24 is disposed parallel to the surface coil 20 at a distance of approximately 1/10 of the diameter of the surface coil 20. The shielding tape 24 completely surrounds the surface coil 20, with the exception of a small gap.

Due to the two identical capacitances 21 and 22 at the coil ends, a voltage node will always be present in the middle of the tape, that is, a maximum current will always flow at this location. The shielding tape 24 has a gap at this location, because the shielding effect for the electrical components from the magnetic field is extremely low at this location in any event. Some electrical interruption in the shielding tape is necessary, however, because the magnetic field lines generated within the surface coil 20 would otherwise be again short circuited. The eddy currents generated by the gradient pulses are also suppressed by this arrangement.

The shielding tape 24 opposes the electrical field components. The capacitative influence remains low because the length of the surface coil 20 formed by the ribbon is extremely short in comparison to the wavelength and, as a consequence of the symmetrical wiring, is divided into two identical halves relative to the voltage node.

As shown in FIG. 3, one embodiment of the surface coil 20a may be in the form of a cylindrical coil forming a short hollow cylinder surrounded by the shielding tape 24a disposed coaxially therewith, and which is also in the form of a hollow cylinder.

A further embodiment as shown in FIG. 4, wherein the surface coil 20b is a spiral coil in one plane, and the shielding tape 24b is annular about the same axis and disposed parallel thereto.

The shielded surface coil shown in the figures can be brought into the measuring field without significantly changing the tuning of the apparatus. Pre-tuning exterior of the coils 3 and 4 for generating the fundamental field is thus made possible.

For frequencies above approximately 50 MHz, however, coils having a plurality of windings are unfavorable, because the natural resonance of these coils is in the range of the operating frequency. A coil having only one winding (with a circumferential length $\simeq \lambda/8$), as shown in FIGS. 2, 3 and 4, is preferably.

Given a small diameter of the surface coil, two or three windings are also possible when the length of the coil ribbon is $\leq \lambda/8$. Given identical measuring conditions, a better signal-to-noise ratio is achieved with the shielded surface coil of FIGS. 2 through 4 than with conventional surface coils without shielding. The frequency detuning is below 0.4% of the operating frequency with a sodium chloride simulated load substantially filling the coil. Given an identical load, the flat embodiment shown in FIG. 4 increases the resonance frequency, which means that the losses due to the eddy currents in the load outweight the electrical losses.

Although modifications and changes may be suggested by those skilled in the art it is the intention of the inventors to embody within the patent warranted hereon all changes and modifications as reasonably and properly come within the scope of their contribution to the art.

We claim as our invention:

1. A nuclear magnetic resonance tomography apparatus for representing internal regions of an examination subject comprising:
   means for generating a fundamental magnetic field in which said examination subject is disposed;
   means for generating a plurality of selected gradient magnetic fields in which said examination subject is disposed;
   means for exciting nuclear spins in said examination subject; and
   a surface coil for acquiring signals corresponding to the displacement of said nuclear spins from an equilibrium position having a ring with free ends connected to ground through respective capacitances and a high-frequency shielding at least partially covering said ring, said shielding having a gap aligned with a center of said ring and symmetrically completely dividing said shielding.

2. A nuclear magnetic resonance tomography apparatus as claimed in claim 1 further comprising a coupling capacitance for high-frequency feed connected to one of said ends of said ring.

3. A nuclear magnetic resonance tomography apparatus as claimed in claim 1 wherein said ring is formed by a metal ribbon.

4. A nuclear magnetic resonance tomography apparatus as claimed in claim 3 wherein said high-frequency shielding is formed by a further metal ribbon and wherein said ring and said shielding are in the form of hollow coaxially disposed cylinders.

5. A nuclear magnetic resonance tomography apparatus as claimed in claim 3, wherein said high-frequency shielding is formed by a further metal ribbon and wherein said ring and said shielding are coaxially disposed in spaced parallel planes.

6. A coil for acquiring signals compriising a ring with free ends connected to ground throuqh respective capacitances and a high-frequency shielding at least partially coverinq said ring, said shielding having a gap aligned with a center of said ring and symmetrically completely dividing said shielding.

7. A coil as claimed in claim 6 further comprising a coupling capacitance for high-frequency feed connected to one of said ends of said ring.

8. A coil as claimed in claim 6 wherein said ring is formed by a metal ribbon.

9. A coil claimed in claim 8 wherein said high-frequency shielding is formed by a further metal ribbon and wherein said ring and said shielding are in the form of hollow coaxially disposed cylinders.

10. A coil as claimed in claim 8 wherein said high-frequency shielding is formed by a further metal ribbon and wherein said ring and said shielding are coaxially disposed in spaced parallel planes.

* * * * *